(12) United States Patent
Lee

(10) Patent No.: US 10,418,209 B2
(45) Date of Patent: Sep. 17, 2019

(54) MAGNETIC CONTROL SWITCH

(71) Applicant: Eaton Corporation, Cleveland, OH (US)

(72) Inventor: Davin Robert Lee, Watertown, WI (US)

(73) Assignee: Eaton Intelligent Power Limited, Dublin (ID)

( * ) Notice: Subject to any disclaimer, the term of this patent is extended or adjusted under 35 U.S.C. 154(b) by 416 days.

(21) Appl. No.: 15/409,683

(22) Filed: Jan. 19, 2017

(65) Prior Publication Data

US 2017/0133178 A1 May 11, 2017

Related U.S. Application Data

(63) Continuation of application No. 14/584,280, filed on Dec. 29, 2014, now Pat. No. 9,558,898.

(51) Int. Cl.
| | |
|---|---|
| *H01H 23/12* | (2006.01) |
| *H01H 47/00* | (2006.01) |
| *H03K 17/97* | (2006.01) |
| *H01H 23/06* | (2006.01) |

(52) U.S. Cl.
CPC ............ *H01H 23/12* (2013.01); *H01H 23/06* (2013.01); *H01H 47/002* (2013.01); *H03K 17/97* (2013.01); *H01H 2223/002* (2013.01)

(58) Field of Classification Search
CPC ...... H01H 23/12; H01H 23/06; H01H 47/002; H03K 17/97
USPC .................................. 335/205–207
See application file for complete search history.

(56) References Cited

U.S. PATENT DOCUMENTS

| | | | |
|---|---|---|---|
| 6,031,439 A | 2/2000 | Adams et al. | |
| 6,566,619 B2 | 5/2003 | Gillman et al. | |
| 6,612,404 B2 | 9/2003 | Sweet et al. | |
| 7,105,762 B1 | 9/2006 | Lee | |
| 7,952,044 B2 | 5/2011 | Lee | |
| 8,570,126 B1 | 10/2013 | Lee et al. | |
| 9,425,008 B1 * | 8/2016 | Lee | ...................... H01H 23/145 |
| 2010/0289484 A1 | 11/2010 | Quinn | |

FOREIGN PATENT DOCUMENTS

DE 102013206518 A1 10/2014

\* cited by examiner

*Primary Examiner* — Bernard Rojas
(74) *Attorney, Agent, or Firm* — Ziolkowski Patent Solution Group, SC

(57) ABSTRACT

A contactless control switch that is resistant to influence from external magnetic fields is disclosed. The switch includes a switch housing, a button moveably mounted to the housing that has at least one protrusion formed on an underside thereof, a circuit board mounted to the housing and including at least one magnet sensor, and a magnet holder positioned adjacent each respective magnet sensor, the magnet holder housing a positive field magnet and a negative field magnet therein and being rotatably mounted to the housing. A respective protrusion interacts with the magnet holder responsive to an actuation of the button by a user, so as to position one of the positive field magnet and the negative field magnet proximate to its respective sensor and the other of the positive field magnet and the negative field magnet distal to its respective sensor.

18 Claims, 6 Drawing Sheets

MAGNETIC CONTROL SWITCH

CROSS-REFERENCE TO RELATED APPLICATIONS

The present invention is a continuation of and claims the benefit of U.S. Ser. No. 14/584,280, filed on Dec. 29, 2014, the disclosure of which is incorporated herein by reference in its entirety.

BACKGROUND OF THE INVENTION

The present invention relates generally to control switches and, more particularly, to a contactless control switch.

Electrical switches are used as control switches for a variety of applications in various industries, with one such example being in specialty vehicle markets—such as heavy trucks, agricultural equipment, and construction equipment, for example—where the switches are employed to control the motor vehicle lighting, the windshield wipers, the rear windshield heating, the cruise control functions, the internal central locking and other functions on and off. Often the control switches are in the form of rocker switches that may be pushed by an operator to rotate/tilt from a neutral position (i.e., switched-off state) to one or more activated positions (i.e., a switched-on state) that control operation of an associated system/component, although control switches may also be constructed as pushbutton switches or toggle switches as other examples.

One type of common control switch is a contactless switch that operates by moving a magnet past a fixed magnetic sensor, such as a Hall effect IC or a magnetoresistive sensor, in order to control and determine the functions/modes provided by the switch. With respect to contactless control switches that are utilized for one of various applications, it is recognized that existing designs of such switches can limit the performance thereof. For example, existing contactless control switches constructions may suffer from issues regarding the ability of the magnetic sensors to detect the magnetic field with sufficient strength, such that discerning a distinct switching position may be difficult. This problem of correctly discerning a distinct switching position may be further compounded if the switch is not constructed in a fashion that provides the magnetic sensors with sufficient protection from external magnetic fields.

It would therefore be desirable to provide a contactless control switch that is resistant to the influence from external magnetic fields. It would further be desirable for such a contactless control switch to be resistant to blockage from mud or other debris, such that the reliability and longevity of the switch may be improved.

BRIEF DESCRIPTION OF THE INVENTION

In accordance with one aspect of the invention, a switch includes a switch housing, a button moveably mounted to the housing and including at least one protrusion formed on an underside thereof, a circuit board mounted to the housing and including at least one magnet sensor, and a magnet holder positioned adjacent each respective one of the at least one magnet sensors, the magnet holder housing a positive field magnet and a negative field magnet therein and being rotatably mounted to the housing. A respective one of the at least one protrusions interacts with the magnet holder responsive to an actuation of the button by a user, so as to position one of the positive field magnet and the negative field magnet proximate to its respective sensor and the other of the positive field magnet and the negative field magnet distal to its respective sensor.

In accordance with another aspect of the invention, a switch includes a switch housing, an operating member mounted to the switch housing and movable between a plurality of positions responsive to physical actuation thereof by an operator, one or more magnet sensors secured relative to the housing, and one or more rotatable magnet holders mounted to the housing such that a rotatable magnet holder is positioned adjacent each of the one or more magnet sensors, with each of the one or more rotatable magnet holders including a positive field magnet and a negative field magnet secured therein. For each of the plurality of positions of the operating member, each of the at one or more rotatable magnet holders is caused to position one of the positive field magnet and the negative field magnet secured therein proximate to its respective magnet sensor and the other of the positive field magnet and the negative field magnet secured therein distal to its respective sensor, such that each of the one or more magnet sensors always senses one of a positive magnetic field and a negative magnetic field.

In accordance with yet another aspect of the invention, a rocker switch includes a switch housing and a rocker button mounted to the switch housing and actuatable between a neutral position, a first position, and a second position. The rocker switch also includes a first magnet holder and a second magnet holder both mounted to the housing so as to be rotatable relative thereto, with each of the first and second magnet holders including therein a positive field magnet and a negative field magnet. The rocker switch further includes a first Hall effect sensor and a second Hall effect sensor positioned adjacent the first magnet holder and the second magnet holder, respectively. The first magnet holder is caused to rotate responsive to actuation of the rocker button between the neutral position and the first position, so as to cause an angular position of the positive field magnet and the negative field magnet in the first magnet holder to change, with the second magnet holder remaining stationary, and the second magnet holder is caused to rotate responsive to actuation of the rocker button between the neutral position and the second position, so as to cause an angular position of the positive field magnet and the negative field magnet in the second magnet holder to change, with the first magnet holder remaining stationary.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Embodiments of the present invention provide a contactless control switch that is resistant to the influence from external magnetic fields. The contactless control switch is constructed to have moveable magnets that provide two or three distinct switching positions, with the magnets always supplying a strong positive or a strong negative magnetic field to two sensors such that a distinct switching position of the vehicle control switch may be easily discerned.

While contactless control switches are described here below as being employed as vehicle control switches, it is recognized that the switches could be used in applications outside of vehicle control switches. Accordingly, embodiments of the invention are not limited to use as vehicle control switches and it is understood that the scope of the invention extends to contactless control switches for various other applications.

Figure 1:
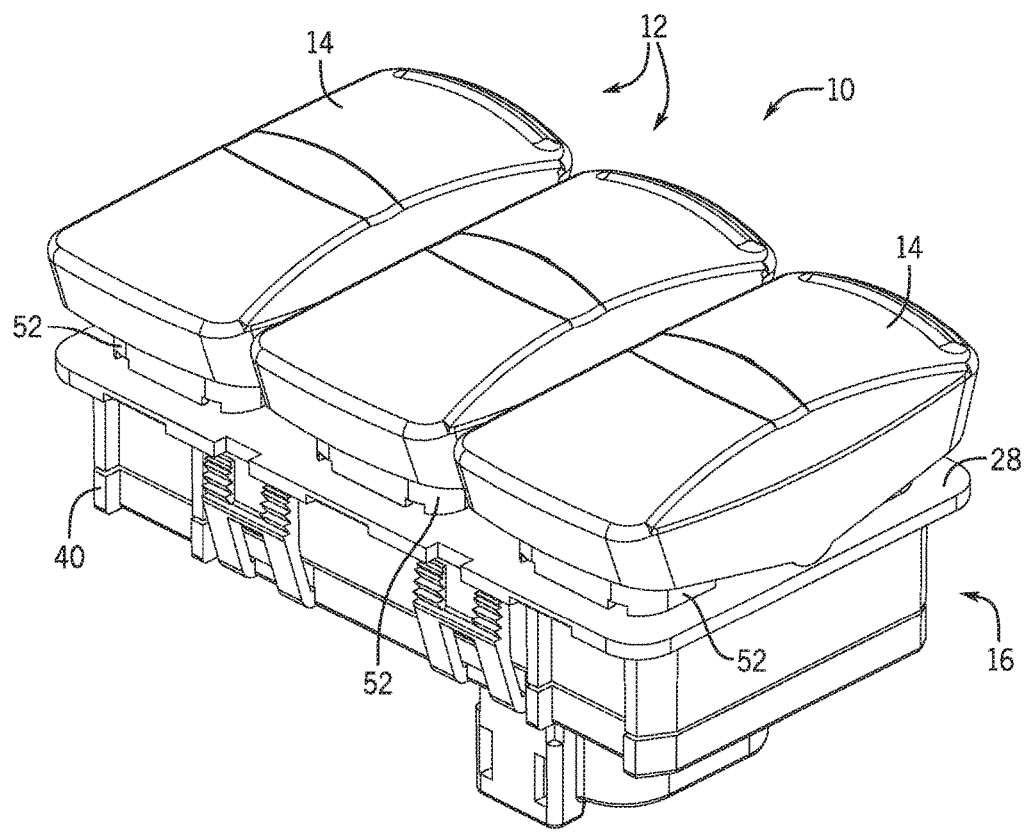
FIG. 1 is a perspective view of a switch module that includes a plurality of control switches, according to an embodiment of the invention.

Referring to FIG. 1, a switch module 10 is illustrated according to an embodiment of the present invention. The switch module 10 includes a number of control switches 12 therein. The switch module 10 includes communication ports and a power receptacle (not shown) formed on a back surface thereof to enable powering of the module and communication to/from the module, such as via mating of the module 10 with a communication interface feature that enables the switch modules to communicate with a communication bus, such as a CAN or LIN bus, for example. It is recognized that a greater or smaller number of switches 12 could be included in the switch module 10, and that the arrangement of switches 12 in the module 10 could differ, such as the switches being arranged in a single row or in two rows, for example. Thus, the switch module 10 illustrated in FIG. 1 is meant to be an example only and is not meant to limit the scope of the invention in any regard.

According to one embodiment, the switch module 10 may be incorporated as part of the dashboard in a motor vehicle, such as a heavy truck, goods vehicle, agricultural equipment, or construction equipment, for example. An operator of the vehicle uses the control switches 12 to operate various functions in the vehicle, such as for switching the motor vehicle lighting, the windshield wipers, the diesel fuel heating, or controlling other specialized equipment on the vehicle—such as a power take-off (PTO) or "safety" related vehicle feature.

As shown in FIG. 1, according to an exemplary embodiment, the control switches 12 are constructed as rocker switches that include an operating member 14—in the form of a rocker button—that is moveably mounted to a switch housing 16. The rocker button 14 is actuated/pushed by an operator to control operation of the respective switch, with the rocker button 14 being movable between a neutral/off position and one or two activated positions. That is, if the operator pushes one side of the rocker button 14, the button is moved to a first activated switch position, and if the operator pushes the other side of the rocker button 14, the button is moved to a second activated switch position.

Figure 2:
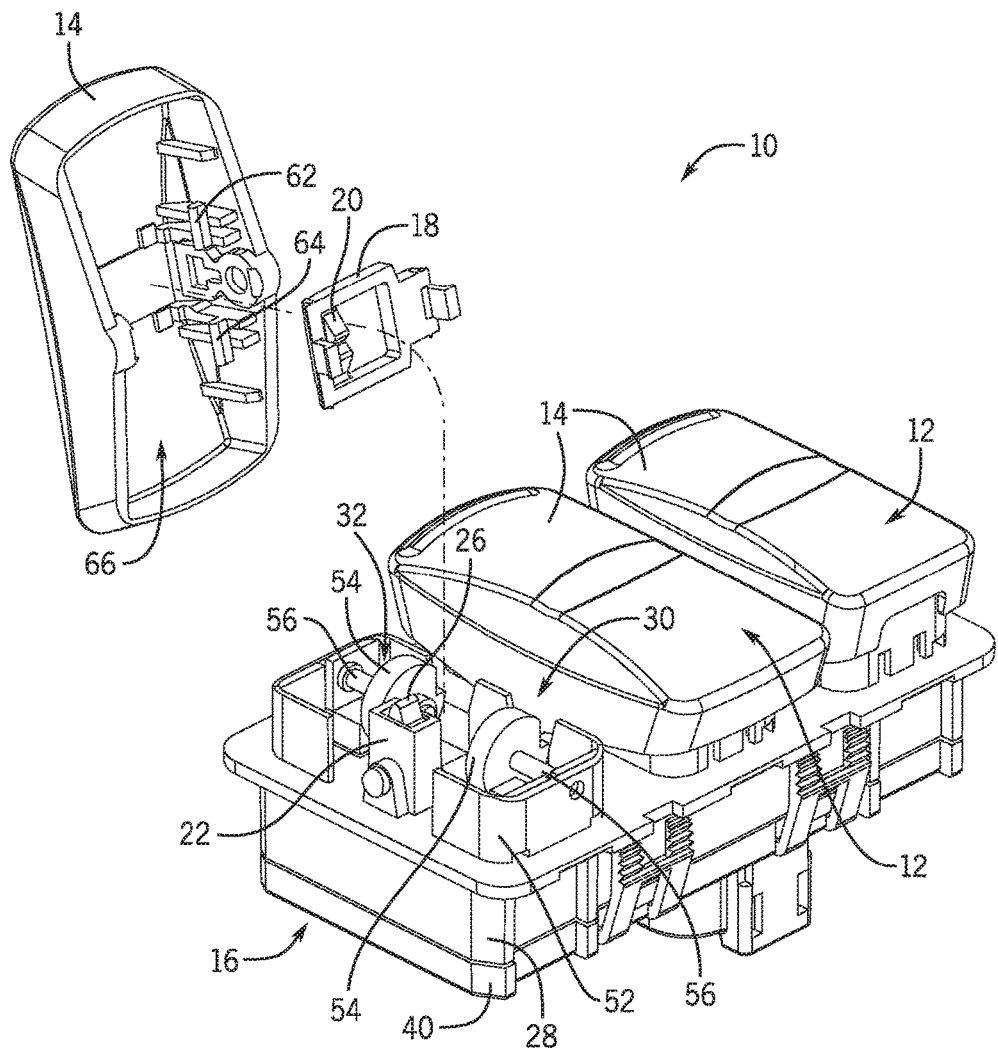
FIG. 2 is a partially exploded view of the switch module of FIG. 1.
Figure 3:
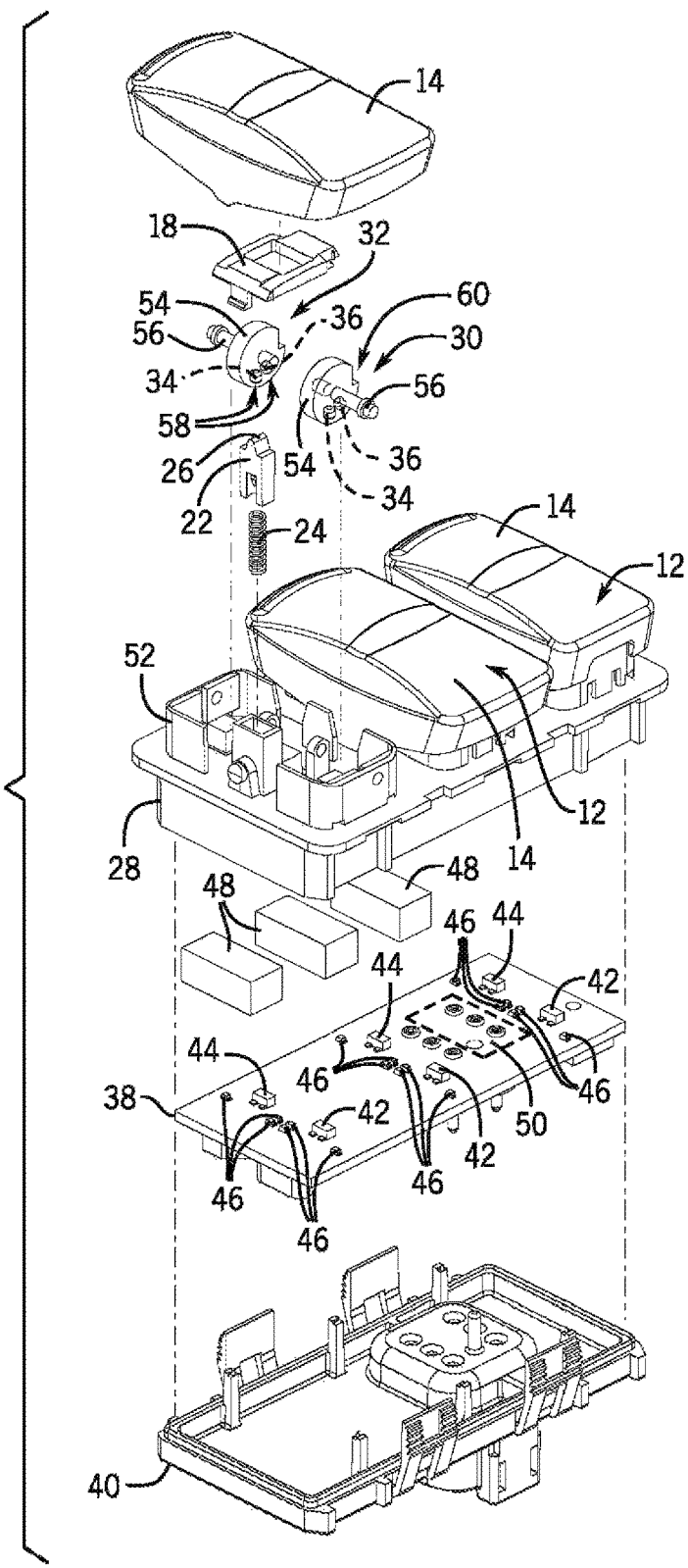
FIG. 3 is an exploded view of the switch module of FIG. 1.

Referring now to FIGS. 2 and 3, partially exploded and fully exploded views of the switch module 10 of FIG. 1 are illustrated. As shown FIGS. 2 and 3, switch 12 includes a switch profile member 18 disposed on an underside of rocker button 14. Switch profile member 18 has a profile contour 20 that is disposed on the underside of button 14 and interacts with a plunger 22 that is biased toward profile contour 20 by a spring 24, with the plunger 22 and spring 24 being surrounded by a seal 25. The contact made by the end 26 of biased plunger 22 against profile contour 20 dictates the tactile response of rocker button 14 felt by the user. The illustrated example shows but one example contour 20, and other contours may be implemented according to embodiments of the invention. Several forms of switching action may be provided by selecting a corresponding profile contour 20. Such switching action can include, for example, momentary, sustained, two position or three position.

As shown in FIG. 3, the switch module 10 also includes a frame 28, magnet holders 30, 32, magnets 34, 36, a printed circuit board ("PCB") assembly 38 and a back cover 40. The PCB assembly 38 includes a pair of electromagnetic sensors 42, 44 thereon—a first sensor 42 and a second sensor 44—that, according to one embodiment, are Hall Effect sensors configured to detect magnets 34, 36, but may instead be magnetoresistive (MR) sensors, for example. Hall Effect sensors 42, 44 act as transducers responsive to the magnetic field of magnets 34, 36, which can be permanent magnets according to one aspect of the present teachings. According to one aspect of the present teachings, back cover 40 and frame 28 together form the switch housing 16, with the PCB assembly 38 being mounted therein. In one embodiment, a top surface of the frame 28 will be generally flush with a system in which the switch module 10 is utilized, such as a vehicle dashboard, for example. When housing 16 is assembled, PCB assembly 38 is mounted within housing 16, so as to be sealed therein such that it is protected from dirt, water, etc. in the ambient environment. Sensors 42, 44 are mounted on PCB 38 within housing 16 so as to be disposed beneath magnets 34, 36, with the frame 28 separating the sensors 42, 44 from the magnets 34, 36 and magnet holders 30, 32. Other electromagnetic sensors may be implemented in lieu of Hall Effect sensors, such as any sensor that can detect electromagnetic field strength. In other aspects, the sensors 42, 44 may be electromagnetic field sensors that act as transducers generating a signal proportional to one or more aspects of the electromagnetic fields generated by magnets. According to other aspects of the present teachings, housing 16 may be formed of a single piece, or more than two pieces. In addition, the PCB assembly 38 may be mounted to the housing 16 in different ways and in different orientations. In one non-limiting example, PCB assembly 38 can be mounted underneath the housing 16.

The PCB assembly 38 also includes light emitting diodes (LEDs) 46 affixed thereto to provide illumination of the rocker button 14 (i.e., graphic icons on the rocker buttons), so as enable identifying of the switch function and provide a visual indication of the switch state to a user. The LEDs 46 emit light through rocker button 14 by passing the light through light pipes 48 constructed from a transparent material that directs the emitted light toward button 14. Light pipes 48 can be molded directly into frame 28 or can be a separate discrete component. The brightness of the LEDs 46 can be controlled, for example, via LIN or CAN messages received by the switches 12.

According to one embodiment, the circuit board 38 may still further include control circuitry (e.g., controller or microprocessor) thereon, generally indicated at 50, that is in operable communication with the sensors 42, 44. The control circuitry 50 is operative to read the outputs of the sensors 42, 44 of each switch 12 and, in response, generate output signals that control operation of devices controlled by the switches. The control circuitry 50 may function as a multiplex communication device (using a CAN or LIN protocol, for example) to interface with other devices or a controller (not shown), or it can output signals directly to an external controller (not shown).

As can be seen in FIG. 3, for each switch 12, a pair of magnet holders 30, 32 is positioned within a respective switch frame 52 that is attached to or formed integrally with frame 28. Each magnet holder 30, 32 includes a circular member 54 and a shaft 56. According to one embodiment, the circular members 54 may be formed of plastic or another easily machineable material that does not attenuate the magnetic field of the magnets 34, 36. The shaft 56 is rotatably coupled to the circular member 54 at a first end thereof and is affixed to the switch frame 52 at a second end thereof, with the shaft 56 functioning to position the circular member 54 in a suspended arrangement relative to the switch frame 52 and allow for rotation of the circular member 54.

The circular member 54 of each respective magnet holder 30, 32 is configured to hold two magnets 34, 36 therein, such as by way of a pair of cavities 58 formed in each magnet holder 30, 32 that are configured to receive the magnets 34, 36. The two magnets 34, 36 positioned in each respective magnet holder 30, 32 are provided as magnets with opposite fields—hereinafter referred to a positive field magnet 34 and negative field magnet 36. In operation of a switch 12, the positioning of the magnets 34, 36 in each circular member 54 relative to their respective sensor 42, 44 can be changed responsive to an actuation of the rocker button 14 by a user, thereby providing an output from the switch 12 indicative of its position. To provide for such positioning of the magnets 34, 36, a notch 60 is formed in each circular member 54 that interacts with a respective protrusion or flange 62, 64 that is formed on the underside 66 of rocker button 14 (FIG. 2)—i.e., first protrusion 62 and second protrusion 64. When the rocker button 14 is actuated by a user, the protrusions 62, 64 formed on the rocker button 14 interact with the notches 60 on the circular members 54 to selectively cause rotation of the circular members 54, thereby positioning one of the positive field magnet 34 and negative field magnet 36 proximate its respective sensor 42, 44. That is, the circular member 54 of each respective magnet holder 30, 32 is driven like a cam in order to selectively rotate and position the positive field magnet 34 and negative field magnet 36 relative to the sensor 42, 44.

Figure 4:
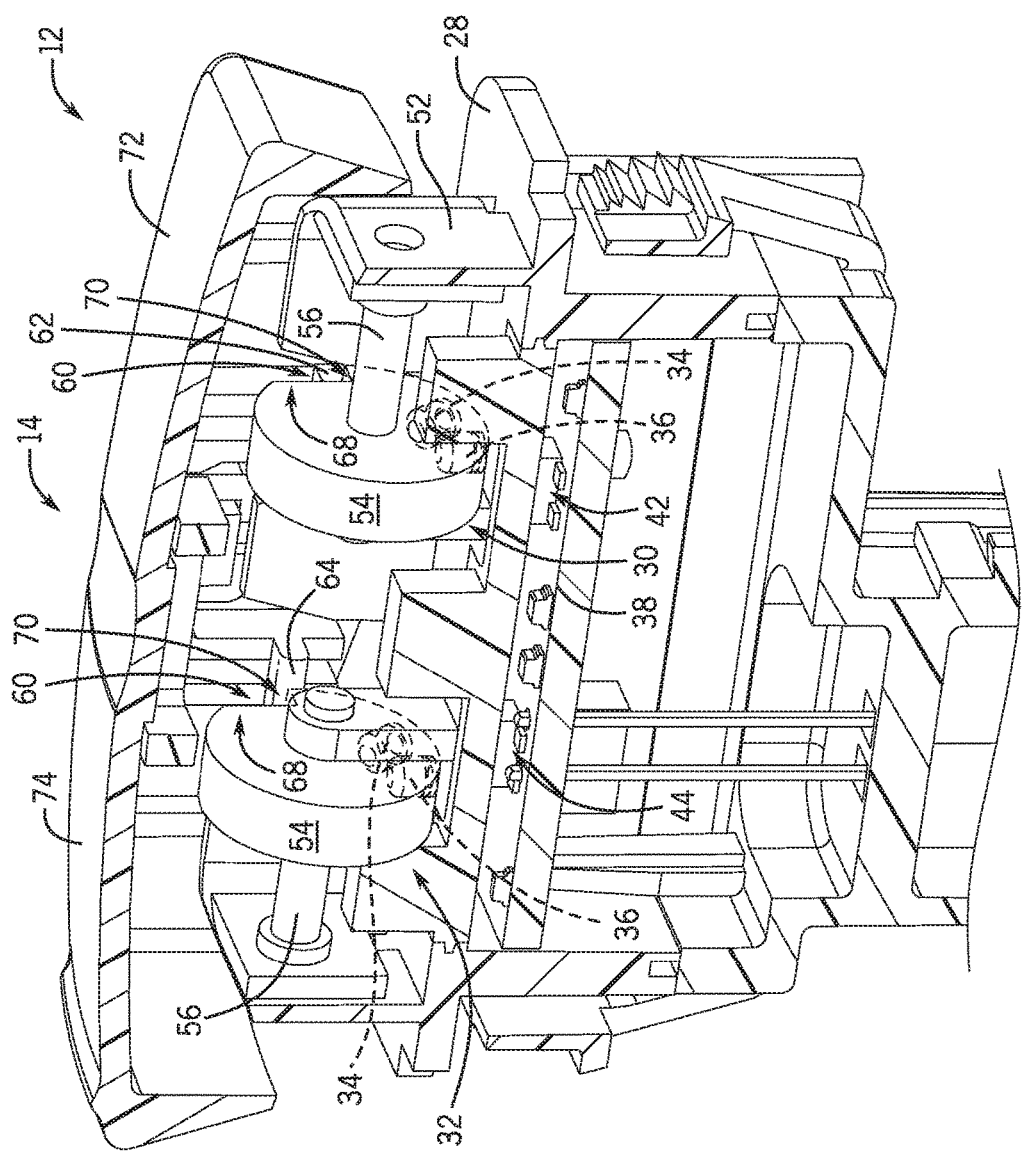
FIGS. 4-6 are sectional views of a control switch in the switch module of FIG. 1 in a neutral position, a first down position, and a second down position.
Figure 5:
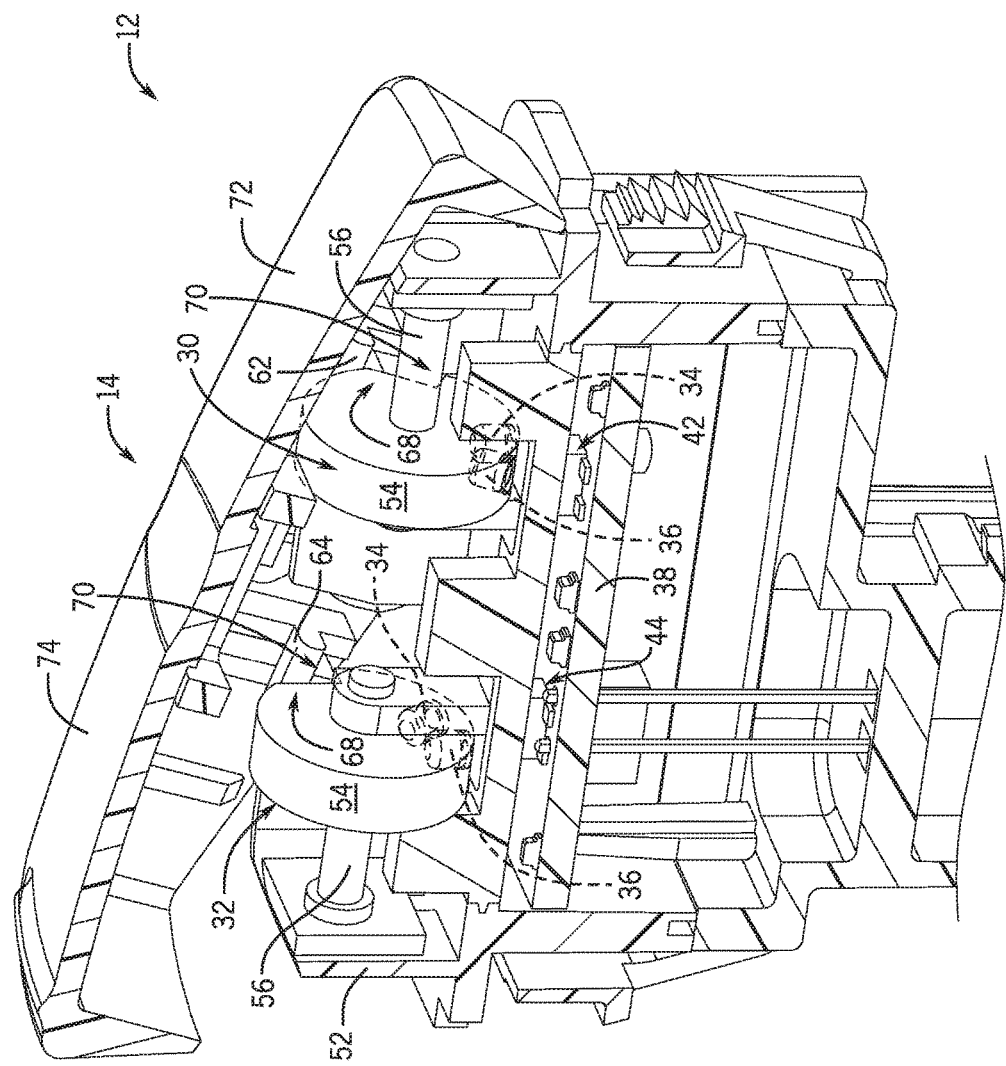
Figure 6:
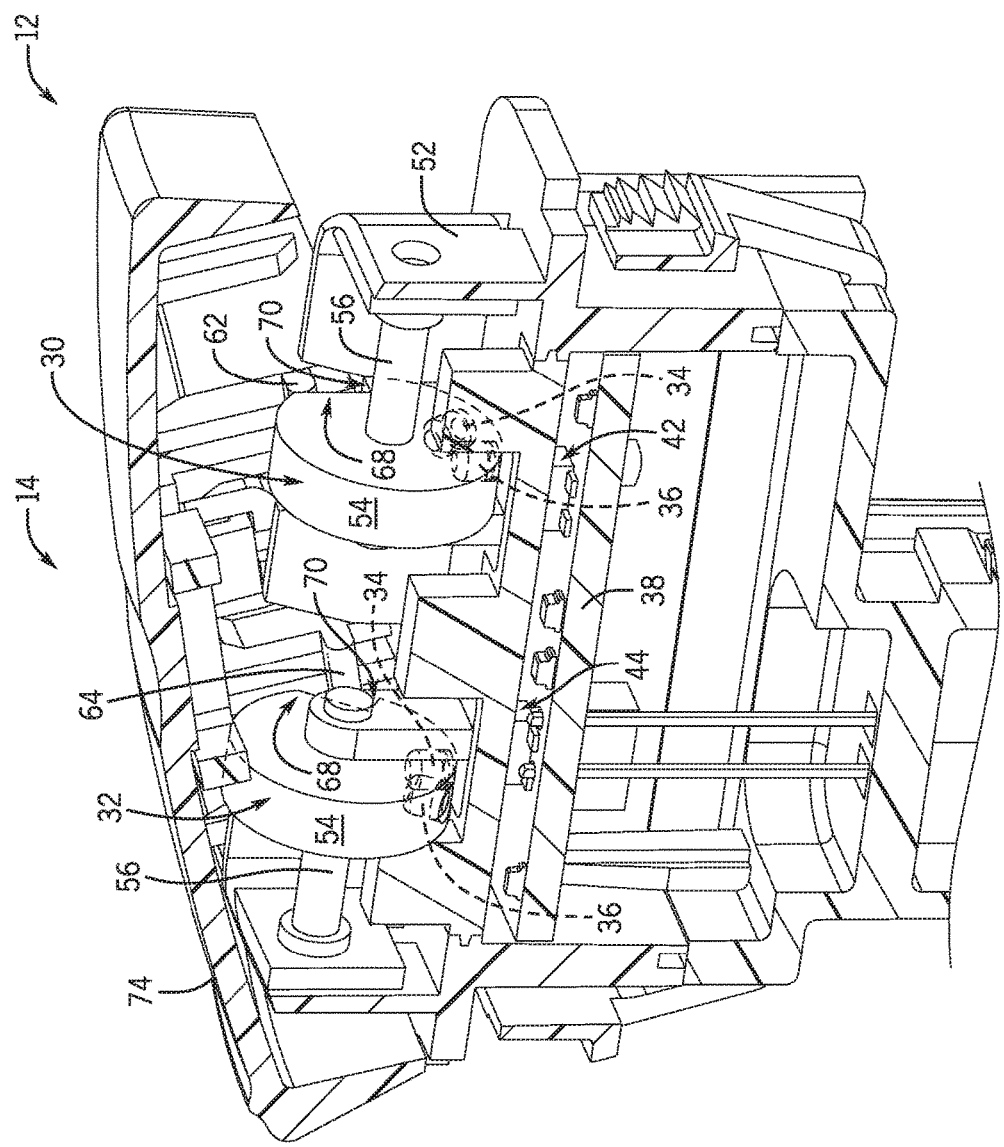

The rotation of the magnet holders 30, 32 and corresponding positioning of the positive field magnet 34 and negative field magnet 36 for each of the actuated positions of the rocker button 14 are illustrated in FIGS. 4-6, in order to better explain the operation of a switch 12 of switch module 10. With reference first to FIG. 4, a switch 12 of switch module 10 is shown in a center or neutral position. When the switch 12 is in a neutral position, the rocker button 14 is oriented such that each of the first protrusion 62 and second protrusion 64 on the underside 66 thereof are positioned in a neutral position between an upward angled surface 68 and a downward angled surface 70 of the notch 60 formed in the circular member 54 of its respective magnet holder. In this neutral position, the first and second protrusions 62, 64 do not apply pressure to either the upward angled surface 68 or the downward angled surface 70 of the notch 60. When the first protrusion 62 and second protrusion 64 are each in their neutral position within the notch 60 of its respective circular member 54, each of the respective circular members 54 is located in an angular position where its negative field magnet 36 is positioned adjacent/proximate its respective sensor 42, 44 and its positive field magnet 34 is positioned away from/distal its respective sensor 42, 44. Accordingly, each of the first and second electromagnetic sensors 42, 44 senses a negative magnetic field, with the sensors 42, 44 and the connected electronics on PCB assembly 38 thus detecting that the switch 12 is not in an activated position (i.e., the neutral position).

Referring next to FIG. 5, a switch 12 of switch module 10 is shown in a "first position," where a lower section/portion 72 of the rocker button 14 has been pressed inward. As rocker button 14 is rotated clockwise from the neutral position to the first position, the first protrusion 62 of rocker button 14 is caused to apply pressure on the downward angled surface 70 of the notch 60 formed in the circular member 54 of the first magnet holder 30. As the first protrusion 62 of the rocker button 14 presses down on the downward angled surface 70 of the notch 60 formed in the circular member 54 of the first magnet holder 30, the circular member 54 is caused to rotate such that the positive field magnet 34 is moved adjacent/proximate to the first sensor 42 and the negative field magnet 36 is moved away from/distal the first sensor 42.

At the same time, as rocker button 14 is rotated clockwise from the neutral position to the first position, the second protrusion 64 of the rocker member 14 is caused to slide upwardly along the upward angled surface 68 of the notch 60 formed in the circular member 54 of the second magnet holder 32. The second magnet holder 32 remains in a stationary position as the second protrusion 64 of the rocker member 14 slides upwardly along the upward angled surface 68 of the notch 60 formed in the circular member 54, and thus the negative field magnet 36 remains in a position adjacent/proximate to the second sensor 44 and the positive field magnet 34 remains in a position away from/distal the second sensor 44—i.e., the positioning of the positive and negative field magnets 34, 36 in the second magnet holder 32 is unchanged from when the switch 12 is in the neutral position.

Accordingly, when the switch 12 is in the first position, the first electromagnetic sensor 42 senses a positive magnetic field and the second electromagnetic sensor 44 senses a negative magnetic field, with the sensors 42, 44 and the connected electronics on PCB assembly 38 thus detecting that the switch 12 is in a first activated position.

Referring next to FIG. 6, a switch 12 of switch module 10 is shown in a "second position," where an upper section/portion 74 of the rocker button 14 has been pressed inward. As rocker button 14 is rotated counterclockwise from the neutral position to the second position, the second protrusion 64 of rocker button 14 is caused to apply pressure on the downward angled surface 70 of the notch 60 formed in the circular member 54 of the second magnet holder 32. As the second protrusion 64 of the rocker button 14 presses down on the downward angled surface 70 of the notch 60 formed in the circular member 54 of the second magnet holder 32, the circular member 54 is caused to rotate such that the positive field magnet 34 is moved adjacent/proximate to the second sensor 44 and the negative field magnet 36 is moved away from/distal the second sensor 44.

At the same time, as rocker button 14 is rotated counter clockwise from the neutral position to the second position, the first protrusion 62 of the rocker member is caused to slide upwardly along the upward angled surface 68 of the notch 60 formed in the circular member 54 of the first magnet holder 30. The first magnet holder 30 remains in a stationary position as the first protrusion 62 of the rocker member slides upwardly along the upward angled surface 68 of the notch 60 formed in the circular member 54, and thus the negative field magnet 36 remains in a position adjacent/proximate to the first sensor 42 and the positive field magnet 34 remains in a position away from/distal the first sensor 42—i.e., the positioning of the positive and negative field magnets 34, 36 in the first magnet holder 30 is unchanged from when the switch 12 is in the neutral position.

Accordingly, when the switch 12 is in the second position, the second electromagnetic sensor 44 senses a positive magnetic field and the first electromagnetic sensor 42 senses a negative magnetic field, with the sensors 42, 44 and the connected electronics on PCB assembly 38 thus detecting that the switch 12 is in a second activated position.

While the switches 12 in switch module 10 are shown and described in FIGS. 1-6 as being rocker switches having a neutral position and two activated positions, it is recognized that the switches 12 could also be constructed as rocker switches having only a neutral/off position and one activated/on position. In such an embodiment, only a single magnet holder 30/32 having positive and negative field magnets 34, 36 therein would be employed—with the magnet holder 30/32 selectively positioning the magnets relative to a single magnet sensor 42/44. The sensor 42/44 would sense either a positive magnetic field or a negative magnetic field, based on the angular position of the magnets 34, 36 within the rotatable magnet holder 30/32, such that the sensor 42/44 could thus determine whether the switch was in the neutral/off position or the activated/on position. Construction of a switch 12 as a pushbutton switch or toggle switch would similarly operate with there being only a single magnet holder 30/32 having positive and negative field magnets 34, 36 therein and a single respective magnet sensor 42/44.

Beneficially, embodiments of the invention thus provide a contactless control switch constructed such that a strong positive or negative magnetic field is always supplied to and sensed by respective magnetic sensors. The contactless control switch is resistant to blockage from mud or other debris due to the rotatable magnet holder being circular in shape, while providing longevity due to its contactless operation. Construction of the control switch as a contactless switch also provides robust sealing against water, dirt, and other contaminants from the ambient environment since no contact is needed between the switch button and the sensor (s), such that would penetrate the molded switch housing. Additionally, the contactless control switch provides lighting to the rocker button at the top, bottom, and center, due to the incorporation of LEDs and light pipes therein. Still further, the profile feature attached to the switch/rocker button provides the "feel" and type of switch action (momentary, sustained, two position, three position, etc, so as to allow an end user to assemble the rocker button/profile to the product, and determine the type of switch.

Therefore, according to one embodiment of the present invention, a switch includes a switch housing, a button moveably mounted to the housing and including at least one protrusion formed on an underside thereof, a circuit board mounted to the housing and including at least one magnet sensor, and a magnet holder positioned adjacent each respective one of the at least one magnet sensors, the magnet holder housing a positive field magnet and a negative field magnet therein and being rotatably mounted to the housing. A respective one of the at least one protrusions interacts with the magnet holder responsive to an actuation of the button by a user, so as to position one of the positive field magnet and the negative field magnet proximate to its respective sensor and the other of the positive field magnet and the negative field magnet distal to its respective sensor.

According to another embodiment of the present invention, a switch includes a switch housing, an operating member mounted to the switch housing and movable between a plurality of positions responsive to physical actuation thereof by an operator, one or more magnet sensors secured relative to the housing, and one or more rotatable magnet holders mounted to the housing such that a rotatable magnet holder is positioned adjacent each of the one or more magnet sensors, with each of the one or more rotatable magnet holders including a positive field magnet and a negative field magnet secured therein. For each of the plurality of positions of the operating member, each of the at one or more rotatable magnet holders is caused to position one of the positive field magnet and the negative field magnet secured therein proximate to its respective magnet sensor and the other of the positive field magnet and the negative field magnet secured therein distal to its respective sensor, such that each of the one or more magnet sensors always senses one of a positive magnetic field and a negative magnetic field.

According to yet another embodiment of the present invention, a rocker switch includes a switch housing and a rocker button mounted to the switch housing and actuatable between a neutral position, a first position, and a second position. The rocker switch also includes a first magnet holder and a second magnet holder both mounted to the housing so as to be rotatable relative thereto, with each of the first and second magnet holders including therein a positive field magnet and a negative field magnet. The rocker switch further includes a first Hall effect sensor and a second Hall effect sensor positioned adjacent the first magnet holder and the second magnet holder, respectively. The first magnet holder is caused to rotate responsive to actuation of the rocker button between the neutral position and the first position, so as to cause an angular position of the positive field magnet and the negative field magnet in the first magnet holder to change, with the second magnet holder remaining stationary, and the second magnet holder is caused to rotate responsive to actuation of the rocker button between the neutral position and the second position, so as to cause an angular position of the positive field magnet and the negative field magnet in the second magnet holder to change, with the first magnet holder remaining stationary.

The present invention has been described in terms of the preferred embodiment, and it is recognized that equivalents, alternatives, and modifications, aside from those expressly stated, are possible and within the scope of the appending claims.

What is claimed is:

1. A switch comprising:
    a switch housing;
    a button moveably mounted to the housing;
    a circuit board mounted to the housing and including at least one magnet sensor; and
    a magnet holder positioned adjacent each respective one of the at least one magnet sensors, the magnet holder housing a positive field magnet and a negative field magnet therein and being rotatably mounted to the housing;
    wherein the button interacts with the magnet holder responsive to an actuation of the button by a user, so as to position one of the positive field magnet and the negative field magnet proximate to its respective sensor and the other of the positive field magnet and the negative field magnet distal to its respective sensor, with the magnet holder rotating about an axis separate from an axis about which the button rotates when actuated.

2. The switch of claim 1 wherein each of the at least one magnet sensors is positioned relative to its respective magnet holder such that one of the positive field magnet and the negative field magnet in its respective magnet holder is always proximate thereto, with a selective rotation of the magnet holder causing one of the positive field magnet and the negative field magnet to be proximate to the magnet sensor.

3. The switch of claim 1 wherein the magnet holder comprises:
a circular member housing the positive field magnet and the negative field magnet therein; and
a shaft rotatably coupled to the circular member at a first end thereof and coupled to the housing at a second end thereof;
wherein the circular member includes a notch formed therein, with a respective one of the at least one protrusions being received in the notch and interacting therewith to selectively cause rotation of the circular member.

4. The switch of claim 3 wherein the switch comprises a rocker switch actuatable between a neutral position, a first position, and a second position, the rocker switch including a first protrusion and a second protrusion formed on an underside thereof; and
wherein the at least one magnet sensor comprises a first magnet sensor and a second magnet sensor.

5. The switch of claim 4 wherein a first magnet holder is positioned adjacent the first magnet sensor and a second magnet holder is positioned adjacent the second magnet sensor, with each of the first and second magnet holders including a positive field magnet and negative field magnet therein.

6. The switch of claim 5 wherein, when the switch is in the neutral position:
the first protrusion interacts with the notch of the circular member of the first magnet holder so as to cause the circular member to be at an angular position where its respective negative field magnet is proximate to the first sensor and its respective positive field magnet is distal to the first sensor; and
the second protrusion interacts with the notch of the circular member of the second magnet holder so as cause the circular member to be at an angular position where its respective negative field magnet is proximate to the second sensor and its respective positive field magnet is distal to the second sensor.

7. The switch of claim 5 wherein, when the switch is in the first position:
the first protrusion interacts with the notch of the circular member of the first magnet holder so as to cause the circular member to be at an angular position where its respective positive field magnet is proximate to the first sensor and its respective negative field magnet is distal to the first sensor; and
the second protrusion interacts with the notch of the circular member of the second magnet holder so as cause the circular member to be at an angular position where its respective negative field magnet is proximate to the second sensor and its respective positive field magnet is distal to the second sensor.

8. The switch of claim 5 wherein, when the switch is in the second position:
the first protrusion interacts with the notch of the circular member of the first magnet holder so as to cause the circular member to be at an angular position where its respective negative field magnet is proximate to the first sensor and its respective positive field magnet is distal to the first sensor; and
the second protrusion interacts with the notch of the circular member of the second magnet holder so as cause the circular member to be at an angular position where its respective positive field magnet is proximate to the second sensor and its respective negative field magnet is distal to the second sensor.

9. The switch of claim 3 wherein the circular member is formed of a plastic material that does not attenuate a magnetic field generated by the positive field magnet and the negative field magnet.

10. The switch of claim 1 wherein the switch housing includes a frame and a back cover, the frame being disposed between the at least one magnet sensor and the magnet holder.

11. The switch of claim 10 wherein the circuit board is positioned below the frame so as to be sealed within the housing, thereby protecting the circuit board from an ambient environment.

12. A switch comprising:
an operating member movable between a plurality of positions responsive to physical actuation thereof by an operator;
one or more magnet sensors positioned beneath the operating member; and
one or more rotatable magnet holders positioned between the operating member and the one or more rotatable magnet holders such that the one or more rotatable magnet holders are selectively rotated responsive to actuation of the operating member, with each of the one or more rotatable magnet holders including a positive field magnet and a negative field magnet secured therein;
wherein, for each of the plurality of positions of the operating member, each of the at one or more rotatable magnet holders is caused to position one of the positive field magnet and the negative field magnet secured therein proximate to its respective magnet sensor and the other of the positive field magnet and the negative field magnet secured therein distal to its respective sensor, such that each of the one or more magnet sensors always senses one of a positive magnetic field and a negative magnetic field.

13. The switch of claim 12 wherein the operating member comprises one or more protrusions formed on an underside thereof, and wherein each of the one or more magnet holders comprises a circular end member in which the positive field magnet and the negative field magnet are secured, the circular end member including a notch formed therein comprising an upward angled surface and a downward angled surface, with a respective one of the one or more protrusions being received in the notch and applying pressure to the upward angled surface and the downward angled surface to selectively cause rotation of the circular end member and alter a position of the positive field magnet and the negative field magnet.

14. The switch of claim 13 wherein the operating member comprises a rocker button actuatable between a neutral position, a first position, and a second position; and
wherein the one or more protrusions comprises a first protrusion and a second protrusion, the one or more magnet sensors comprises a first magnet sensor and a second magnet sensor, and the one or more rotatable magnet holders comprises a first rotatable magnet holder and a second rotatable magnet holder, with the first rotatable magnet holder being positioned adjacent the first magnet sensor and the second rotatable magnet holder being positioned adjacent the second magnet sensor.

15. The switch of claim 14 wherein, responsive to the operating member being actuated between the neutral position and the first position:
the first protrusion interacts with the notch of the circular member of the first rotatable magnet holder so as to cause the first rotatable magnet holder to rotate and alter a position of the positive and negative field magnets of the first rotatable magnet holder, with the negative field magnet being proximate to the first sensor when the operating member is in the neutral position and the positive field magnet being proximate to the first sensor when the operating member is in the first position; and the second protrusion interacts with the notch of the circular member of the second rotatable magnet holder such that the second rotatable magnet holder remains stationary, with the negative field magnet of the second rotatable magnet holder being proximate to the second sensor when the operating member is in both the neutral position and the first position.

16. The switch of claim 14 wherein, responsive to the operating member being actuated between the neutral position and the second position:

the second protrusion interacts with the notch of the circular member of the second rotatable magnet holder so as to cause the second rotatable magnet holder to rotate and alter a position of the positive and negative field magnets of the second rotatable magnet holder, with the negative field magnet being proximate to the second sensor when the operating member is in the neutral position and the positive field magnet being proximate to the second sensor when the operating member is in the second position; and the first protrusion interacts with the notch of the circular member of the first rotatable magnet holder such that the first rotatable magnet holder remains stationary, with the negative field magnet of the first rotatable magnet holder being proximate to the first sensor when the operating member is in both the neutral position and the second position.

17. The switch of claim 13 wherein each of the one or more magnet holders further comprises a shaft rotatably coupled to the circular end member at a first end thereof and coupled to the switch housing at a second end thereof, so as to provide for rotation of the magnet holder thereabout.

18. The switch of claim 13 wherein each of the one or more magnet holders rotates about an axis separate from an axis about which the operating member rotates when actuated.

* * * * *